United States Patent [19]

Elsaesser et al.

[11] Patent Number: 5,376,496
[45] Date of Patent: Dec. 27, 1994

[54] RADIATION-SENSITIVE MIXTURE, RADIATION-SENSITIVE RECORDING MATERIAL PRODUCED THEREWITH CONTAINING HALOGENATED METHYL GROUPS IN THE POLYMERIC BINDER

[75] Inventors: Andreas Elsaesser, Idstein; Hans W. Frass, Wiesbaden; Dieter Mohr, Budenheim, all of Germany

[73] Assignee: Hoechst Aktiengesellschaft, Frankfurt am Main, Germany

[21] Appl. No.: 648,143

[22] Filed: Jan. 30, 1991

[30] Foreign Application Priority Data

Feb. 2, 1990 [DE] Germany .................. 4003025

[51] Int. Cl.$^5$ .................. G03F 7/023; G03F 7/004
[52] U.S. Cl. .................. 430/165; 430/191; 430/192; 430/193; 430/270; 430/907; 430/914
[58] Field of Search ............... 430/192, 193, 191, 165, 430/166, 907, 270, 914

[56] References Cited

U.S. PATENT DOCUMENTS

| | | | |
|---|---|---|---|
| 3,515,552 | 6/1970 | Smith | 96/35.1 |
| 3,779,778 | 12/1973 | Smith et al. | 96/115 R |
| 3,869,292 | 3/1975 | Peters | 96/115 R |
| 4,139,384 | 2/1979 | Iwasaki et al. | 96/33 |
| 4,189,323 | 2/1980 | Buhr | 430/281 |
| 4,247,611 | 1/1981 | Sander et al. | 430/286 |
| 4,248,957 | 2/1981 | Sander et al. | 430/270 |
| 4,311,782 | 1/1982 | Buhr et al. | 430/270 |
| 4,551,409 | 11/1985 | Gulla et al. | 430/192 |
| 4,619,998 | 10/1986 | Buhr | 544/193.1 |
| 4,678,737 | 7/1987 | Schneller et al. | 430/270 |
| 4,699,867 | 10/1987 | Schneller et al. | 430/192 |
| 4,822,719 | 4/1989 | Schneller et al. | 430/270 |
| 4,910,119 | 3/1990 | Schneller et al. | 430/192 |

FOREIGN PATENT DOCUMENTS

| | | |
|---|---|---|
| 0187517 | 7/1986 | European Pat. Off. . |
| 0307828 | 3/1989 | European Pat. Off. . |
| 0365318 | 4/1990 | European Pat. Off. . |
| 3820699 | 12/1989 | Germany . |
| 51-36129 | 3/1976 | Japan . |
| 739654 | 11/1955 | United Kingdom . |

Primary Examiner—Charles L. Bowers, Jr.
Assistant Examiner—John S. Chu
Attorney, Agent, or Firm—Foley & Lardner

[57] ABSTRACT

A radiation-sensitive mixture, a radiation-sensitive recording material produced from the mixture, and a process for producing heat-resistant and chemical-resistant relief copies using the recording material are disclosed. The normally positive-working radiation-sensitive mixture contains (1) a water-insoluble polymeric binder which is soluble in aqueous alkaline solutions, and
(2) a 1,2-quinone diazide and/or a combination of
   a compound which forms strong acid when exposed to actinic radiation and
   a compound containing at least one acid-cleavable C—O—C bond.

The polymeric binder has a molecular weight of between about 5,000 and 100,000 and a content of phenolic hydroxyl groups of about 1 to 15, preferably about 2 to 10, mmol/g of polymer. It has a content of —$CH_{3-n}X_n$ units of at least 0.1, preferably about 0.5 to 2, mmol/g of polymer, X being halogen such as chlorine, bromine or iodine and n being 1, 2 or 3. Lithographic plates are produced with the mixture which are thermally postcurable, have a high print run and have good resistance to chemicals. Photoresists having high heat resistance can also be produced with the mixture.

21 Claims, No Drawings

5,376,496

RADIATION-SENSITIVE MIXTURE, RADIATION-SENSITIVE RECORDING MATERIAL PRODUCED THEREWITH CONTAINING HALOGENATED METHYL GROUPS IN THE POLYMERIC BINDER

BACKGROUND OF THE INVENTION

The present invention relates to a radiation-sensitive mixture, a recording material produced therewith and also to a process for producing heat-resistant and chemical-resistant relief copies using the recording material. The invention is based on a positive-working radiation-sensitive or photosensitive mixture containing:

(a) a water-insoluble polymeric binder which is soluble in aqueous/alkaline solutions, and
(b) a 1,2-quinone diazide and/or a combination of
a compound which forms strong acid when exposed to actinic radiation, and
a compound containing at least one clearable C—O—C bond as essential constituents.

Positive-working photosensitive mixtures, i.e., mixtures of the constituents mentioned in which a copying layer, becomes soluble in the areas exposed to light, are known and have been described for a wide variety of possible applications, such as for producing lithographic plates or photoresists.

A substantial proportion of the properties of these copying layers is determined by the quantitative main constituent of the radiation-sensitive or photosensitive mixture, the binder. The binders used for positive copying layers are virtually exclusively phenol/formaldehyde or cresol/formaldehyde condensation products of the novolak type. For some applications of positive copying layers, however, the resulting properties are still not ideal. This relates, in particular, to the heat resistance in the case of photoresist applications and the length of the print runs when used as lithographic plates.

It has been found that substitution of the novolaks by binders having a higher glass transition temperature results in a generally better property profile. Thus, a whole series of alkali-soluble binders have been described for positive copying layers such as, for example, naphthol-based phenolic resins (U.S. Pat. No. 4,551,409), homopolymers and copolymers of vinylphenols (DE 2,322,230, corresponding to U.S. Pat. No. 3,869,292 and DE 3,406,927, corresponding to U.S. Pat. No. 4,678,737), polymers of the esters of acrylic acids with phenols (Japanese Published Specification 76/36129, EP 212,440 and EP 212,439) or copolymers of hydroxyphenylmaleimides (EP 187,517).

Binders of the type mentioned have not hitherto been able, however, to find practical application. One reason for this is that these polymers do not satisfactorily fulfill an essential requirement imposed on binders of positive copying layers, that of the possibility of thermal self-crosslinking. This property, which exists in the case of novolaks, is of importance if the copying layer is to withstand aggressive chemicals.

DE 3,820,699 describes polymers based on hydroxybenzylacrylamides which fulfill the requirement for crosslinkable alkali-soluble monomeric components. It is disadvantageous, however, that the polymer can contain these monomers only in a limited amount since otherwise photosensitivity and development behavior are unfavorably affected.

It is also known to incorporate units in the polymers which, although they are not alkali-soluble, make possible thermal crosslinking, such as the polymers, described in EP 184,044, corresponding to U.S. Pat. No. 4,699,867, containing crosslinkable —$CH_2$—OR units, where R is hydrogen, or alkyl or acyl groups. However, these units also impair the development behavior if they are contained in the polymers in the amounts necessary for a reliable thermal postcuring.

SUMMARY OF THE INVENTION

It is therefore an object of the invention to provide a positive-working radiation-sensitive mixture for a recording material. The recording material can be used to produce lithographic plates having higher print run performance and photoresists having improved heat resistance. It is thermally crosslinkable without impairment of its photosensitivity and its development behavior.

These and other objects according to the invention are provided with a positive-working radiation-sensitive mixture, comprising, in admixture:

(1) a water-insoluble polymeric binder which is soluble in aqueous alkaline solutions, and
(2) at least one of a 1,2-quinone diazide and a combination of
a compound which forms strong acid when exposed to actinic radiation, and
a compound containing at least one acid-clearable C—O—C bond, said polymeric binder having a molecular weight of between about 5,000 and 100,000, a content of phenolic hydroxyl groups of about ]to 35 mmol/g of polymer and a content of —$CH_{3-n}X_n$ units of at least 0.1 mmol/g of polymer, where X is halogen and n is 1, 2 or 3.

Also provided according the invention is a radiation-sensitive recording material comprising a layer of the radiation-sensitive mixture deposited on a layer base. A process for producing chemical-resistant and heat-resistant relief copies with this recording material comprises the steps of imagewise exposing the recording material, developing the imagewise exposed recording material with an aqueous/alkaline developer solution to produce a relief image, and heating the relief image to an elevated temperature layer for 0.5 to 60 minutes at a temperature in the range from 150° to 280° C.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

A positive working radiation-sensitive mixture according to the invention contains, as the binder, a polymer having a molecular weight of about 5,000 to 100.000. a content of phenolic hydroxyl groups of about 1 to 15 mmol/g of polymer and a content of —$CH_{3-n}X_n$ units of at least 0.1 mmol/g of polymer, where X is halogen and n is 1, 2 or 3.

Preferably, the polymer according to the invention has a content of about 2 to 10 mmol/g of phenolic hydroxyl groups and a content of about 0.5 to 2 mmol/g of —CH$_{3-n}$X$_n$ units.

If the phenolic hydroxyl groups and the crosslinkable —CH$_{3-n}$X$_n$ units are not within the same monomer unit, the polymeric binder is preferably a copolymer containing:
(a) units of the formula I

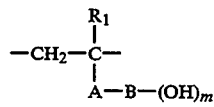

where
R$_1$ is hydrogen or (C$_1$-C$_4$)alkyl,
A is a single bond, —O—, —S—, —N(R$_2$)—, —CO—, —CS—, —CO—O—, —CO—N(R$_2$)—, —CO—O—C(R$_2$)$_2$—, —CO—N(R$_2$)—C(R$_2$)$_2$—, —O—C(R$_2$)$_2$—, —S—C(R$_2$)$_2$—, or —N(R$_2$)—C(R$_2$)$_2$,
where
R$_2$ is hydrogen or (C$_1$-C$_4$)alkyl or (C$_1$-C$_4$)alkylene,
B is a monocyclic or bicyclic carbocyclic aromatic ring system, optionally substituted by alkyl, alkoxy, halogen or aryl, and m is 1 or 2, and
(b) units of the formula II

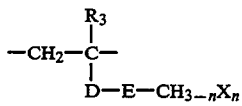

where
R$_3$ is hydrogen or (C$_1$-C$_4$)alkyl,
D is a single bond, (C$_1$-C$_4$)alkylene, —O—, —S—, —N(R$_2$)—, —CO—, —CS—, —CO—O—, —CO—N(R$_2$)—, —CO—O—C(R$_2$)$_2$—, —CO—N(R$_2$)—C(R$_2$)$_2$—, —O—C(R$_2$)$_2$—, or —N(R$_2$)—C(R$_2$)$_2$,
where
R$_2$ is hydrogen (C$_1$-C$_4$)alkyl or (C$_1$-C$_4$)alkylene,
E is a single bond, (C$_1$-C$_4$)alkylene, (C$_1$-C$_4$)hydroxyalkylene or B,
X is halogen, and
n 1, 2 or 3.

In particular, the copolymer contains:
(a) units of the formula I in which
R$_2$ is hydrogen or methyl,
A is —CO—O—, —CO—N(R$_2$)—, —CO—O—C(R$_2$)$_2$—, —CO—N(R$_2$)—C(R$_2$)$_2$—, —O—C(R$_2$)$_2$—, —S—C(R$_2$)$_2$—, or —N(R$_2$)—C(R$_2$)$_2$,
where
R$_2$ is hydrogen,
B is phenyl, and
m is 1 or 2, and
(b) units of the formula II in which
R$_3$ is hydrogen or methyl,
D is a single bond, —O—, —N(R$_2$)—, —CO—, —CO—O—, —CO—N(R$_2$)—, —CO—O—C(R$_2$)$_2$—, —CO—N(R$_2$)—C(R$_2$)$_2$—,
where
R$_2$ is hydrogen,
E is a single bond, (C$_1$-C$_2$)alkylene, (C$_1$-C$_2$)hydroxyalkylene or phenyl,
X is chlorine or bromine, and
n is 1, 2 or 3.

If the phenolic hydroxyl groups and crosslinkable —CH$_{3-n}$X$_n$ units are situated within the same monomer unit, the binder according to the invention contains, as homopolymer or copolymer, units of the formula III:

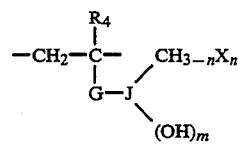

where
R$_4$ is hydrogen or (C$_1$-C$_4$)alkyl,
G is a single bond, —O—, —S—, —N(R$_5$)—, —CO—, —CS—, —CO—O—, —CO—N(R$_5$)—, —CO—O—C(R$_5$)$_2$—, —CO—N(R$_5$)—C(R$_5$)$_2$—, —O—C(R$_2$)$_2$—, —S—C(R$_5$)$_2$—, or —N(R$_5$)—C(R$_5$)$_2$,
where
R$_5$ is hydrogen, (C$_1$-C$_4$)alkyl or (C$_1$-C$_4$)alkylene,
J is a monocyclic or bicyclic carbocyclic aromatic ring system optionally substituted by alkyl, alkoxy, halogen or aryl,
X is halogen,
m is 1 or 2, and
n is 1, 2 or 3.

In particular, the homopolymer or copolymer contains units of the formula III in which
R$_4$ is hydrogen or methyl,
G is a single bond or —CO—O—,
J is phenyl,
X is chlorine,
m is 1 or 2, and
n is 1.

It may be advantageous if the polymeric binder is a copolymer which contains units of formulae I, II and III.

Those radiation-sensitive mixtures are preferred in which a copolymer which contains units of the formulae I and II and/or III is present as a polymeric binder.

Homo- or copolymers corresponding to the formulae I, II or III preferably contain chlorine, bromine or iodine, in particular chlorine, for X as halogen. It has been found that m and n are preferably equal to 1.

As examples of a monocyclic or bicyclic carbocyclic aromatic ring systems, mention may be made of a benzene or a naphthalene nucleus, of which the benzene nucleus is preferred.

Preferred monomer units corresponding to formula I are, for example, N-(4-hydroxyphenyl)methacrylamide, N-(4-hydroxyphenyl)-acrylamide, o-, m- and p-hydroxyphenyl acrylate or methacrylate, and o-, m- and p-hydroxystyrene, 4-hydroxy-3-methylstyrene, 4-hydroxy-3,5-dimethylbenzyl methacrylate or methacrylamide and N-(4-hydroxyphenyl)maleimide.

Preferred examples of monomer units corresponding to formula II include 2-, 3-, and 4-chloromethylstyrene, vinyl chloroacetate, vinyl trichloroacetate, chloromethyl acrylate or methacrylate, 1- or 2-chloroethyl acrylate or methacrylate, N-(2,2,2-trichloro-2-hydroxyethyl)acrylamide or -methacrylamide, chloromethyl vinyl ketone, 3-chloro-2-hydroxypropyl acrylate or methacrylate.

Preferred monomer units of the formula III are, in particular, the chloromethylated derivatives of the monomers corresponding to formula I.

In addition to the monomer units described, the polymers may contain units which serve to adjust or adapt the polymer properties to specific applications. In the case of dry resist applications, low polymer glass transition temperatures tend to be advantageous and these can be established, for example, by copolymerization with alkyl acrylates or methacrylates or alkyl vinyl ethers, the alkyl group containing 4–12 carbon atoms. For printing-plate copying layer applications, high glass transition temperatures tend to be advantageous. High glass transition temperature, a good oleophilic character of the copying layer film and the content of phenolic hydroxyl groups, which is important for the solubility in alkali, are achieved by copolymerization with styrene, α-methylstyrene, vinyl toluene, phenyl, benzyl, furfuryl or methyl methacrylate, acrylonitrile or methacrylonitrile. It is also possible to incorporate in the binders by polymerization small amounts of bifunctional monomers or monomers which, in the presence of acid, result in a thermal crosslinking reaction, for example, those having lateral ——$CH_2OR$ groups, corresponding to EP 184,044, or monomers containing epoxide units.

It has been found that the presence of at least 0.1 mmol of —$CH_{3-n}X_n$ units/g of polymer is sufficient for thermal crosslinking. In order to achieve a beneficial full curing, a content of about 0.5 to 2, in particular of about 1, mmol/g of polymer has proved to be beneficial. If necessary, even higher amounts may be present without other properties being disadvantageously affected.

The polymers according to the invention are prepared by homopolymerization or copolymerization of monomers which contain crosslinkable —$CH_{3-n}X_n$ units and/or by subsequently introducing the —$CH_{3-n}X_n$ units into the polymers. In particular, in the case of the chloromethyl groups, this is achieved in a simple and known way by a reaction with chloromethyl alkyl ethers in the presence of acid.

The homopolymerization of the monomers with units of the formulae I to III or their copolymerization with other monomers can be carried out by conventional methods, for example, in the presence of a polymerization initiator such as azobisisobutyronitrile in organic solvents such as methyl ethyl ketone or tetrahydrofuran at elevated temperatures for a time period of 1 to 20 hours. In addition, however, suspension, emulsion or bulk polymerization which may be initiated by radiation, heat or ionic initiators, is also possible.

To produce the mixtures according to the invention, the binder described, which is present in amounts in the range from about 10 to 95% by weight, based on nonvolatile constituents of the mixture, is combined with photosensitive compounds or mixtures having a solubility in an aqueous/alkali developer solution that is increased by an exposure to light. These include 1,2-quinone diazides and mixtures of photolytic acid donors and acid-clearable compounds.

Preferred 1,2-quinone diazides are naphthoquinone 1,2-diazide-(2)-4- or -5-sulfonic acid esters or amides. Of these, the esters, in particular those of the 5-sulfonic acids, are preferred. Suitable compounds of this type are known and are described, for example, in DE 938,233, corresponding to GB 739,654.

The amount of o-quinone diazide compounds is generally about 3 to 50, preferably about 7 to 35, percent by weight, based on the nonvolatile components of the mixture.

It is also possible to use the 1,2-quinone diazide compounds in the form of their esters with the polymers according to the invention.

The corresponding 1,2-quinone diazide acid chlorides are esterified with the hydroxyl groups of the basic polymers by processes known in the literature (DE 2,507,548, corresponding to U.S. Pat. No. 4,139,384).

Materials based on acid-cleavable compounds can also be used to good effect in the mixture according to the invention. As acid-clearable compounds, mention may especially be made of (a) those containing at least one orthocarboxylic acid ester and/or carboxylic acid amide acetal grouping, it being possible for the compounds also to have a polymeric nature and the groupings mentioned to occur as linking elements in the main chain or as lateral substituents, (b) oligomeric or polymeric compounds containing repeating acetal and/or ketal groupings in the main chain, and (c) compounds containing at least one enol ether or N-acylaminocarbonate grouping.

Acid-clearable compounds of the type (a) as components of radiation-sensitive mixtures are extensively described in EP 022,571, corresponding to U.S. Pat. No. 4,311,782; mixtures which contain compounds of the type (b) are described in DE 2,306,248, corresponding to U.S. Pat. No. 3,779,778, and in DE 2,718,254 and U.S. Pat. No. 4,189,323; compounds of the type (c) are disclosed in EP 006,627, corresponding to U.S. Pat. No. 4,248,957.

The nature and amount of the clearable compound may vary according to the application. Preferred are proportions of between about 5 and 70 percent by weight, in particular between about 5 and 40 percent by weight, based on the nonvolatile components of the mixture.

Suitable radiation-sensitive components which form strong acids on exposure to illumination include a large number of known compounds and mixtures such as phosphonium, sulfonium and iodonium salts, halogen compounds and organometallic-organohalogen combinations.

The phosphonium, sulfonium and iodonium compounds are typically used in the form of their salts which are soluble in organic solvents, usually as a precipitation product with complex acids such as hydrofluoroboric acid, hexafluorophosphoric acid, hexafluoroantimonic acid and hexafluoroarsenic acid.

In principle, all the organic halogen compounds which are also known as photochemical free-radical starters, for example, those containing at least one halogen atom on a carbon atom or on an aromatic ring, can be used as halogen-containing radiation-sensitive compounds which form hydrohalic acid (U.S. Pat. No. 3,515,552). Of these compounds, the s-triazine derivatives containing halomethyl groups, in particular trichloromethyl groups, and an aromatic or unsaturated substituent in the triazine nucleus such as those described in DE 2,718,259, corresponding to U.S. Pat. No. 4,189,323, are preferred. 2-Trihalomethyl-1,3,4-oxadiazoles are also suitable. The action of these halogen-containing compounds can also be spectrally affected and increased by known sensitizers.

Examples of suitable photochemical acid donors include 4-methyl-6-trichloromethyl-2-pyrone, 4-(3,4,5-trimethoxystyryl)-6-trichloromethyl-2-pyrone, 4-(4-methoxystyryl)6-(3,3,3-trichloropropenyl)-2-pyrone, 2-trichloromethylbenzimidazole, 2-tribromomethylquinoline, 2,4-dimethyl-1-tribromoacetylbenzoic acid, 1,4-bisdibromomethylbenzene, trisdibromomethyl-s-triazine, 2-(6-methoxy-2-naphthyl)-, 2-(1-naphthyl)-, 2-(4-ethoxyethyl-1-naphthyl)-, 2-(benzo-3-pyranyl)-, 2-(4-methoxy-1-anthracyl)-, 2-(4-styrylphenyl)-, 2-(9-phenanthryl)-4,6-bistrichloromethyl-s-triazine and the compounds cited in the examples.

The amount of the photochemical acid donor may, depending on its chemical nature and the composition of the layer, also vary considerably. Beneficial results are obtained with about 0.5 to 20 percent by weight, based on the total solids. For photosensitive layers having thicknesses of over 0.01 mm, in particular, it is advisable to use relatively small amounts of acid donor.

Additionally, numerous other oligomers and polymers can also be used concomitantly, for example, phenolic resins of the novolak type or vinyl polymers such as polyvinyl acetals, polymethacrylates, polyacrylates, polyvinyl ethers and polyvinylpyrrolidones, which may themselves be modified by comonomers.

The most beneficial proportion of these additives depends on the application requirements and the effect on the development conditions, and is generally not more than about 20 percent by weight of the polymer used according to the invention. For specific requirements such as flexibility, adhesion, luster, etc., the radiation-sensitive layer may also contain small amounts of substances such as polyglycols, cellulose ethers, for example, ethylcellulose, wetting agents and finely-divided pigments.

Furthermore, soluble or finely-divided, dispersible dyestuffs and, depending on the application, also UV absorbers, may be added to the radiation-sensitive mixture. The triphenylmethane dyestuffs, in particular in the form of their carbinol bases, have proved particularly advantageous as dyestuffs. The most favorable quantity ratios of the components can readily be determined in the individual case by preliminary experiments.

The invention also relates to a radiation-sensitive recording material comprising a layer base and a radiation-sensitive layer of a mixture according to the invention deposited on said base.

To coat a suitable layer base, the mixture is generally dissolved in a solvent. The choice of solvents has to be adapted to the intended coating process, the layer thickness and the drying conditions. Suitable solvents for the mixture according to the invention are ketones such as methyl ethyl ketone, chlorinated hydrocarbons such as trichloroethylene and 1,1,1-trichloroethane, alcohols such as n-propanol, ethers such as tetrahydrofuran, alcohol ethers such as ethylene glycol monoethyl ether and esters such as butyl acetate. Mixtures may also be used which may additionally contain solvents for specific purposes, such as acetonitrile, dioxane or dimethylformamide. In principle any solvent can be used which does not react irreversibly with the layer components. Partial ethers of glycols, in particular, ethylene glycol monomethyl ether and propylene glycol monomethyl ether, alone or as a mixture, are particularly preferred.

Metals are usually used as layer bases for layer thicknesses less than approximately 10 μm. For offset printing plates, use may be made of mill-finished, mechanically and/or electrochemically roughened and optionally anodized aluminum, which may additionally have been pretreated chemically, for example, with polyvinylphospnonic acid, silicates, phosphates, hexafluorozirconates or with hydrolyzed tetraethyl orthosilicate.

The layer base is coated in a known manner by spin-coating, spraying, immersion, rolling, or by means of sheet dies, doctor blades or by casting.

For exposure to illumination, the standard light sources such as fluorescent lamps, xenon pulse lamps, metal-halide-doped high-pressure mercury vapor lamps and carbon arc lamps may be used.

In this description, exposure to illumination or irradiation is understood to mean exposure to actinic electromagnetic radiation in wavelength ranges below about 500 nm. All radiation sources which emit in this wavelength range are suitable.

Advantageously, a laser irradiation apparatuses may also be used, in particular automatic processing systems which contain, for example, an argon or krypton ion laser, as radiation source.

The radiation can furthermore De carried out with electron beams. In this case, acid-forming compounds which are not photosensitive in the normal sense may also be used as initiators of the solubilization reaction, for example, halogenated aromatic compounds or halogenated polymeric hydrocarbons. X-rays may also be used for image production.

The layer which has been exposed or irradiated imagewise can be removed in a known manner with virtually the same developers known for commercial naphthoquinone diazide layers and photoresists, or the materials according to the invention may be adjusted in their copying behavior advantageously to the known aids such as developers and programmed spray development apparatus. The aqueous developer solutions may contain, for example, alkali-metal phosphates, silicates or hydroxides, wetting agents and also, optionally, smaller proportions of organic solvents. particular cases, solvent/water mixtures may also be used as developers. The choice of the most beneficial developer can be determined by experiments with the layer used in a particular case. If necessary, the development may be promoted mechanically.

In particular, the recording material according to the invention can be used in a process for producing chemical-resistant and heat-resistant relief copies, in which process a radiation-sensitive recording material comprising a layer base and a radiation-sensitive layer is exposed imagewise and developed with an aqueous/alkaline developer solution, and the relief image obtained, which is optionally coated with a hydrophilic protective film, is heated to an elevated temperature.

The process is one which uses a radiation-sensitive recording material according to the invention and heats the developed layer for about 0.5 to 60 minutes at a temperature in the range from about 150° to 280° C.

In the case of lithographic plates, a heating time in the lower range, for instance from about 0.5 to 6 minutes, and in the case of photoresists, a heating time in the upper range, for example, from about 10 to 60 minutes, is preferably used.

The invention provides radiation-sensitive mixtures and recording materials which have good photosensitivity and perfect development behavior, which produce high print runs, which exhibit an outstanding heat resistance when used as photoresist, and which can be postcured, in particular thermally postcured, and, after postcuring, have a better resistance to chemicals than known materials.

Examples of preferred embodiments are specified below. In the examples, parts by weight (ppw) and parts by volume (ppv) are in the ratio of g to cm³. Percentage and quantity ratios, unless otherwise specified, are to be understood in units of weight. Monomers and polymers useful in the practice of the present invention are shown in Tables 1 and 2, respectively.

TABLE 1

| Monomer No. | Name | Corresp. formula |
|---|---|---|
| 1 | N-(4-Hydroxyphenyl)methacrylamide | I |
| 2 | 2-Hydroxyphenyl methacrylate | I |
| 3 | 2,3-Dihydroxyphenyl methacrylate | I |
| 4 | 4-Hydroxystyrene | I |
| 5 | Mixture of 3- and 4-chloromethyl-styrene (60/40) | II |
| 6 | Mixture of 3- and 4-bromomethyl-styrene (60/40) | II |
| 7 | Vinyl chloroacetate | II |
| 8 | Chloromethyl methacrylate | II |
| 9 | 2-Chloroethyl methacrylate | II |
| 10 | N-(2,2,2-trichloro-1-hydroxyethyl)-acrylamide | II |
| 11 | 3-Chloro-2-hydroxypropyl methacrylate | II |
| 12 | 3-Chloromethyl-4-hydroxystyrene | III |
| 13 | Isomeric mixture of various chloro-methyl-2-hydroxyphenyl methacrylates | III |
| 14 | Isomeric mixture of various chloro-methyl-2,3-dihydroxyphenyl methacrylates | III |
| 15 | Styrene | — |
| 16 | Methylstyrene | — |
| 17 | Furfuryl methacrylate | — |
| 18 | N-methoxymethylmethacrylamide | — |
| 19 | N,N'-methylenebismethacrylamide | — |

7.0 ppw (parts by weight) of binder (cf. Table 3),
1.5 ppw of an esterification product of 3 mol of 1,2-naphthoquinone-(2)-diazide-5-sulfonyl chloride and 1 mol of 2,3,4-trihydroxybenzophenone,
0.2 ppw of 1,2-naphthoquinone-(2)-diazide-4-sulfonyl chloride,
0.08 ppw of Victoria pure blue (C.I. 44 045),
100 ppw of a tetrahydrofuran and propylene glycol monomethyl ether solvent mixture (55:45).

A layer thickness of 2 $\mu$m results after drying for 2 minutes at 100° C.

Photosensitivity test:

The printing plates are exposed for 60 seconds (s) under a 5 kW metal halide lamp at a distance of 110 cm through a continuous-tone step wedge having 13 density steps of 0.15 each ("BK 01" exposure wedge supplied by Hoechst AG) and developed for 60 seconds in one of the following developers:

Developer A:
8.5 ppw of $Na_2SiO_3.9H_2O$,
0.8 ppw of NaOH, and
1.5 ppw of $Na_2B_4O_7.10H_2O$ in
89.2 ppw of $H_2O$.

Developer B:
5.3 ppw of sodium metasilcate nonahydrate,
3.4 ppw of trisodium phosphate dodecahydrate,
0.3 ppw of sodium hydrogenphosphate (anhydrous),
91.0 ppw of water.

Developer C:
A mixture of
50.0 ppw of developer B and
50.0 ppw of $H_2O$.

TABLE 2

| Polymer No. | Monomer 1 [mol %] | Monomer 2 [mol %] | Monomer 3 [mol %] | Polymers $M_w$ | mmol OH g | mmol $CH_{3-n}X_n$ g | Note |
|---|---|---|---|---|---|---|---|
| 1 | 1 (85) | 18 (15) | — | 20,000 | 5.0 | — | Comparison (EP 184 044) |
| 2 | 1 (85) | 5 (15) | — | 18,000 | 4.9 | 0.87 | |
| 3 | 2 (85) | 18 (15) | — | 20,000 | 5.0 | — | Comparison |
| 4 | 2 (85) | 5 (15) | — | 18,000 | 4.9 | 0.86 | |
| 5 | 3 (85) | 18 (15) | — | 19,000 | 9.2 | — | Comparison |
| 6 | 3 (85) | 5 (15) | — | 17,000 | 9.1 | 0.80 | |
| 7 | 4 (85) | 18 (15) | — | 23,000 | 7.0 | — | Comparison |
| 8 | 4 (85) | 5 (15) | — | 20,000 | 6.8 | 1.20 | |
| 9 | 2 (65) | 5 (15) | 15 (20) | 18,000 | 4.1 | 0.94 | |
| 10 | 2 (65) | 6 (15) | 15 (20) | 14,000 | 3.9 | 0.90 | |
| 11 | 2 (65) | 7 (15) | 15 (20) | 13,000 | 4.2 | 0.97 | |
| 12 | 2 (65) | 8 (15) | 15 (20) | 13,000 | 4.1 | 0.96 | |
| 13 | 2 (65) | 9 (15) | 15 (20) | 19,000 | 4.1 | 0.94 | |
| 14 | 2 (65) | 10 (15) | 15 (20) | 13,000 | 3.8 | 0.89 | |
| 15 | 2 (65) | 11 (15) | 15 (20) | 19,000 | 4.0 | 0.92 | |
| 16 | 2 (65) | 11 (15) | 16 (20) | 18,000 | 3.9 | 0.90 | |
| 17 | 2 (65) | 11 (15) | 17 (20) | 18,000 | 4.0 | 0.92 | |
| 18 | 2 (85) | 11 (13) | 18 (2) | 19,000 | 4.8 | 0.73 | |
| 19 | 2 (85) | 11 (13) | 18 (2) | 19,000 | 4.8 | 0.79 | |
| 20 | 2 (85) | 11 (13) | 19 (2) | 34,000 | 4.8 | 0.73 | Comparison |
| 21 | 14 (15) | 3 (85) | — | 20,000 | 9.9 | 0.75 | |
| 22 | 13 (15) | 2 (85) | — | 18,000 | 5.4 | 0.81 | |
| 23 | 12 (15) | 4 (85) | — | 22,000 | 7.8 | 1.18 | |
| 24 | 12 (12) | 4 (88) | — | 22,000 | 7.9 | 0.85 | |
| 25 | 12 (9) | 4 (91) | — | 22,000 | 8.0 | 0.72 | |
| 26 | 12 (6) | 4 (94) | — | 21,000 | 8.1 | 0.49 | |
| 27 | 12 (3) | 4 (97) | — | 21,000 | 8.2 | 0.25 | |
| 28 | — | 4 (100) | — | 21,000 | 8.3 | 0.0 | Comparison |
| 29 | Cresol-formaldehyde-novolak | | | 6,000 | 5.7 | — | Comparison |

EXAMPLE 1

An aluminum plate toughened electrolytically in hydrochloric acid, anodized in sulfuric acid and hydrophilized with polyvinylphosphonic acid is spin-coated with the following solution:

The photosensitivity is assessed on the basis of step 3 of the continuous-tone step wedge:
open = already free of copying layer;
not open = copying layer residues still present.
Thermal crosslinking behavior test:

The plates are then fully exposed on a half side and baked for 5 minutes at 230° C. in a resist drying oven. The chemical resistance of the baked plates is tested with dimethylformamide in the unexposed and exposed areas:

+ = no attack;
− = attack.

Development behavior test:

The exposed plates are developed for 15 seconds and then inked with commercial black offset ink. The occurrence of tone in the image-free areas is assessed.

Results of the photosensitivity, thermal crosslinking and development behavior tests are summarized in Table 3.

Printing tests were carried out on a number of these plates in the nonthermally cured state in a sheet-fed offset press. Table 4 shows the results.

EXAMPLE 2

An aluminum plate toughened electrolytically in hydrochloric acid, anodized in sulfuric acid and hydrophilized with polyvinylphosphonic acid is spin-coated with the following solution:

7.0 ppw of binder (cf. Table 5),
1.5 ppw of an esterification product of 3 mol of 1,2-naphthoquinone-(2)-diazide-4-sulfonyl chloride and 1 mol of 2,3,4-trihydroxybenzophenone,
0.2 ppw of 1,2 naphthoquinone-(2)-diazide-4-sulfonyl chloride,
0.08 ppw of Victoria pure blue (C.I. 44 045),
100 ppw of a tetrahydrofuran and propylene glycol monomethyl ether solvent mixture (55:45).

A layer thickness of 2 μm results after drying for 2 minutes at 100° C.

TABLE 3

| Ex. No. | Binder (from Tab. 2) | Classification (e = invention formula) | Developer | Half-tone step 3 | Development | Chemical resistance after baking unexposed | Chemical resistance after baking exposed |
| --- | --- | --- | --- | --- | --- | --- | --- |
| 1-1 | 1 | Comparison | A | open | tone | + | + |
| 1-2 | 2 | e: I + II | A | " | tone-free | + | + |
| 1-3 | 3 | Comparison | A | " | tone | + | + |
| 1-4 | 4 | e: I + II | A | " | tone-free | + | + |
| 1-5 | 5 | Comparison | C | " | tone | + | + |
| 1-6 | 6 | e: I + II | C | " | tone-free | + | + |
| 1-7 | 7 | Comparison | B | " | tone | + | + |
| 1-8 | 8 | e: I + II | B | " | tone-free | + | + |
| 1-9 | 21 | e: III | C | " | " | + | + |
| 1-10 | 22 | e: III | A | " | " | + | + |
| 1-11 | 23 | e: III | B | " | " | + | + |
| 1-12 | 29 | Comparison | A | " | " | + | + |

TABLE 4

| Example | | Polymer | Print run |
| --- | --- | --- | --- |
| 1-2 | e | 2 | 150,000 |
| 1-4 | e | 4 | 160,000 |
| 1-6 | e | 6 | 160,000 |
| 1-8 | e | 8 | 150,000 |
| 1-10 | e | 22 | 140,000 |
| 1-12 | (Comparison) | 29 | 90,000 |

The photosensitivity, the thermal crosslinking behavior and the development behavior were tested as described in Example 1. Table 5 shows the results.

The Examples show (1) the suitability of polymers according to the invention which comprise different units corresponding to formula II. and (2) that polymers having a molecular weight of greater than 100,000 can no longer be developed sufficiently rapidly.

TABLE 5

| Ex. No. | Binder (from Tab. 2) | Classification (e = invention formula) | Developer | Half-tone step 3 | Development | Chemical resistance after baking unexposed | Chemical resistance after baking exposed |
| --- | --- | --- | --- | --- | --- | --- | --- |
| 2-1 | 9 | e | A | open | tone-free | + | + |
| 2-2 | 10 | e | A | " | " | + | + |
| 2-3 | 11 | e | A | " | " | + | + |
| 2-4 | 12 | e | A | " | " | + | + |
| 2-5 | 12 | e | A | " | " | + | + |
| 2-6 | 14 | e | A | " | " | + | + |
| 2-7 | 15 | e | A | " | " | + | + |
| 2-8 | 16 | e | A | " | " | + | + |
| 2-9 | 17 | e | A | " | " | + | + |
| 2-10 | 18 | e | A | " | still free | + | + |
| 2-11 | 19 | e | A | " | " | + | + |
| 2-12 | 20 | Comparison | A | " | tone | + | + |

The results show that printing-plate copying layers produced with polymers according to the invention result in a higher print run than conventional positive copying layers containing novolaks as binders, that, as a result of thermal postcuring, they become resistant to aggressive chemicals even in preexposed regions, and that they do not have any disadvantages in relation to photosensitivity and development.

EXAMPLE 3

An aluminum plate roughened electrolytically in hydrochloric acid, anodized in sulfuric acid and hydrophilized with polyvinylphosphonic acid is spin-coated with the following solution:

5.0 ppw of binder (cf. Table 6),
0.5 ppw of an esterification product of 3 mol of 1,2-naphthoquinone-(2)-diazide-4-sulfonylchloride and 1 mol of 2,3,4-trinydroxybenzophenone, 1.4 ppw of an oligomeric acetal which was obtained by polycondensation of triethylene glycol and 2-ethylbutyraldehyde, hydroxyl number 140, 0.2 ppw of 2-(4-styrylphenyl)-4,6-bistrichloro-methyl-s-triazine, 0.03 ppw of crystal violet base (C.I. 42 555:1), 100 ppw of a tetrahydrofuran and propylene glycol monomethyl ether solvent mixture (55:45).

A layer thickness of 2 μm results after drying for 2 minutes at 100° C.

A nonphotosensitive top layer of polyvinyl alcohol, having a K-value of 4 and a residual acetyl group content of 12% (corresponding to DE 3,715,790) was then deposited from water in a thickness of 0.2 μm on this copying layer.

The plates are exposed under a master as in Example 1 for 25 seconds, heated for 1 minute at 80° C. and then developed. Photosensitivity, development and thermal crosslinking behavior are tested as in Example 1. The top layer is washed off with $H_2O$ before the thermal curing.

Results of the photosensitivity, thermal crosslinking and development behavior tests are summarized in Table 6.

TABLE 6

| Ex. No. | Binder (from Tab. 2) | Classification (e = invention formula) | Developer | Half-tone step 3 | Development | Chemical resistance after baking unexposed | exposed |
|---|---|---|---|---|---|---|---|
| 3-1 | 23 | e | B | open | tone-free | + | + |
| 3-2 | 24 | e | B | " | " | + | + |
| 3-3 | 25 | e | B | " | " | + | + |
| 3-4 | 26 | e | B | " | " | + | + |
| 3-5 | 27 | e | B | " | " | + | + |
| 3-6 | 28 | Comparison | B | " | " | − | − |

The results show that the content of crosslinkable —$CH_{3-n}X_n$ units in the polymer must be above 0.1 mmol/g of polymer in order to ensure a chemical resistance of the crosslinked film.

EXAMPLE 4

To produce a positive dry resist, coating solutions are prepared from:

40.0 ppw of binder (cf. Table 3),
10.0 ppw of a compound containing acid-clearable C—O—C units (Table 7),
0.5 ppw of a photochemical acid former (Table 7),
6.0 ppw of polyethyl acrylate,
0.01 ppw of crystal violet base (C.I. 42 555:1),
100 ppw of butanone.

The solutions are each spun onto 26-μm thick, biaxially-stretched and heat-set polyethylene terephthalate sheets, and then post-dried for 10 minutes at 100° C. in a circulating-air drying oven. The rotation speed of the spinner is regulated so that a layer thickness of 25 μm is produced. A polyethylene sheet is also clad onto it as a protection against dust and scratches.

To produce conductor boards, after peeling off the top sheet, the dry resist is laminated in a commercial laminator onto a cleaned, preheated base which is composed of an insulating material having a 35 μm thick copper coating on one or both sides. After peeling off the base foil and possibly post-drying, exposure is carried out under a master using a 5 kW metal-halide lamp at a distance of 110 cm for 30 seconds, and development is then carried out after a waiting time of 15 minutes in 1%-strength sodium hydroxide solution for 90 seconds.

The resist templates produced were heat treated for over 30 minutes at 150° C. and then subjected to the following tests:

1. Resistance to electroplating (Buildup of Pb/Sn alloy),
2. Etch resistance (ammoniacal Cu(II) chloride solution),
3. Solvent resistance (immersion for 8 hours in isopropanol).

The results are shown in Table 7. The following compounds containing acid-clearable C—O—C units were used:

No. 1: Polymeric orthoester prepared by condensing trimethyl orthoformate with 4-oxa-6,6-bishydroxymethyl-1-octanol, No. 2: Polyacetal prepared from triethylene glycol and 2-ethylbutyraldehyde, hydroxyl number 140.

The following photochemical acid formers were used:

No. 1: 2-(4-ethoxy-1-naphthyl)-4,6-bistrichloromethyl-s-triazine,

No. 2: 2-(4-styrylphenyl)-4,6-bistrichloromethyl-s-triazine.

TABLE 7

| Ex. No. | Polymer | Acid-cleavable compound | Photochemical acid former | Resistance to electroplating | Etch resistance | Solvent resistance |
|---|---|---|---|---|---|---|
| 4-1 | 2 | 1 | 1 | + | + | + |
| 4-2 | 2 | 1 | 2 | + | + | + |
| 4-3 | 2 | 2 | 1 | + | + | + |
| 4-4 | 2 | 2 | 2 | + | + | + |
| 4-5 | 4 | 2 | 2 | + | + | + |
| 4-6 | 23 | 2 | 2 | + | + | + |

EXAMPLE 5

To test the effect of a baking gum on the thermal crosslinking behavior, the following test is carried out with the printing plates from Example 1.

After exposing and developing the printing plates as described in Example 1, they are manually gummed with a commercial baking gum (RC 99 supplied by HOECHST AG) and then baked for 5 minutes at 230° C. in a drying oven. After rinsing off the gum with water, the chemical resistance is tested with dimethylformamide in the usual manner.

Table 8 below shows the results.

TABLE 8

| Example | Polymer (Table 2) | Chemical |
| --- | --- | --- |
| 5-1 | 2 | + |
| 5-2 | 4 | + |
| 5-3 | 6 | + |
| 5-4 | 8 | + |
| 5-5 | 21 | + |
| 5-6 | 22 | + |
| 5-7 | 23 | + |

No impairment of the thermal crosslinking behavior of the polymers according to the invention is to be observed as a result of the baking gum.

What is claimed is:

1. A positive-working radiation-sensitive mixture, comprising, in admixture:

(1) a water-insoluble polyraeric binder which is soluble in aqueous alkaline solutions, and
   (2) at least one of a 1,2-quinone diazide and a combination of
      a compound which forms strong acid when exposed to actinic radiation, and
      a compound containing at least one acid-cleavable C—O—C bond, wherein the polymeric binder has a molecular weight of between about 5,000 and 100,000, a content of phenolic hydroxyl groups of about 1 to 15 mmol/g of polymer and a content of $-CH_{3-n}X_n$ units of at least 0.1 mmol/g of polymer, where X is halogen and n is 1, 2 or 3, said binder consisting essentially of monomers selected from the group consisting of:

(a) N-(4-hydroxy-phenyl) maleimide or a unit of the formula I

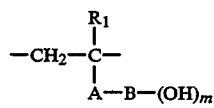

I where
   $R_1$ is hydrogen or $(C_1-C_4)$alkyl,
   A is a single bond, —O—, —S—, —N(R$_2$)—, —CO—, —CS—, —CO—O—, —CO—N(R$_2$)—, —CO—O—C(R$_2$)$_2$—, —CO—N(R$_2$)—C(R$_2$)$_2$—, —O—C(R$_2$)$_2$—, —S—C(R$_2$)$_2$—, or —N(R$_2$)—C(R$_2$)$_2$—,
   $R_2$ is hydrogen or $(C_1-C_4)$alkyl,
   B is a monocyclic or bicyclic carbocyclic aromatic ring system, optionally substituted by alkyl, alkoxy, hylogen or aryl, and m is 1 or 2, (b) unit of the formula II

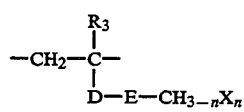

II where
   $R_3$ is hydrogen or $(C_1-C_4)$alkyl,
   D is a single bond, $(C_1-C_4)$alkylene, —O—, —S—, —N(R$_2$)—, —CO—, —CS—, —CO—O—, —CO—N(R$_2$)$_2$—, —CO—O—C(R$_2$)$_2$—, —CO—N(R$_2$)—C(R$_2$)$_2$—, —O—C(R$_2$)$_2$—, —S—C(R$_2$)$_2$—, or —N(R$_2$)—C(R$_2$)$_2$—,
   E is a single bond, $(C_1-C_4)$alkylene, $(C_1-C_4)$hydroxyalkylene or B,
   X is halogen, and
   n is 1, 2 or 3, and (c) a unit of the formula III

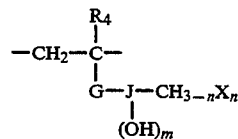

where
   $R_4$ is hydrogen or $(C_1-C_4)$alkyl,
   G is a single bond, $(C_1-C_4)$alkylene, —O—, —S—, —N(R$_5$)—, —CO—, —CS—, —CO—O—, —CO—N(R$_5$)—, —CO—O—C(R$_5$)$_2$—, —CO—N(R$_5$)—C(R$_5$)$_2$—, —O—C(R$_5$)$_2$—, —S—C(R$_5$)$_2$— or —N(R$_5$)—C(R$_5$)$_2$—,
   $R_5$ is hydrogen, $(C_1-C_4)$alkyl,
   J is a monocyclic or bicyclic carbocyclic aromatic ring system optionally substituted by alkyl, alkoxy, halogen or aryl,
   X is halogen,
   m is 1 or 2, and
   n is 1, 2 or 3.

2. A mixture as claimed in claim 1, wherein the polymeric binder is a polymer having a content of about 2 to 10 mmol/g of phenolic hydroxyl groups and a content of about 0.5 to 2 mmol/g of $-CH_{3-n}X_n$ units.

3. A mixture as claimed in claim 1, wherein the polymeric binder is a copolymer consisting essentially of:
   (a) units of the formula I and
   (b) units of the formula II.

4. A mixture as claimed in claim 3, wherein the copolymer consists essentially of:
   (a) units of the formula I in which
   $R_1$ is hydrogen or methyl,
   A is —CO—O—, —CO—N(R$_2$)—, —CO—O—C(R$_2$)$_2$—, —CO—N(R$_2$)—C(R$_2$)$_2$—, —O—C(R$_2$)$_2$—, —S—C(R$_2$)$_2$—, or —N(R$_2$)—C(R$_2$)$_2$,
   where
   $R_2$ is hydrogen,
   B is phenyl, and
   m is 1 or 2, and
   (b) units of the formula II in which
   $R_3$ is hydrogen or methyl,
   D is a single bond —O— or —NR$_2$—, —CO—, —CO—O—, —CO—N(R$_2$)—, —CO—O—C(R$_2$)$_2$—, —CO—N(R$_2$)—C(R$_2$)$_2$—,
   where
   $R_2$ is hydrogen,
   E is a single bond, $(C_1-C_2)$alkylene, $(C_1-C_2)$hydroxyalkylene or phenyl,
   X is chlorine or bromine, and
   n is 1, 2 or 3.

5. A mixture as claimed in claim 1, wherein the polymeric binder is a homopolymer or copolymer consisting essentially of units of the formula III.

6. A mixture as claimed in claim 5, wherein the homopolymer or copolymer consists essentially of units of the formula III in which
   $R_4$ is hydrogen or methyl,
   G is a single bond or —CO—O—,
   J is phenyl,
   X is chlorine,
   m is 1 or 2, and
   n is 1.

7. A mixture as claimed in claim 1, wherein said polymeric binder is a copolymer consisting essentially of units of the formulae I, II and III.

8. A mixture as claimed in claim 1, wherein said polymeric binder is a copolymer consisting essentially of units of the formulae I and II or units of the formula I and III.

9. A mixture as claimed in claim 1, wherein X is chlorine, bromine or iodine.

10. A mixture as claimed in claim 9, wherein X is chlorine.

11. A mixture as claimed in claim 1, wherein n is 1.

12. A mixture as claimed in claim 3, wherein m is 1.

13. A mixture as claimed in claim 3, wherein B is a benzene nucleus,

14. A radiation-sensitive recording material comprising:
 a layer base, and
 a radiation-sensitive layer of a mixture as claimed in claim 1 deposited on said base.

15. A mixture as claimed in claim 1, wherein said polymeric binder is a copolymer consisting of monomers selected from the group consisting of (a) N-(4-hydroxy-phenyl)maleimide or a unit of the formula I, (b) a unit of the formula II and (c) a unit of the formula III.

16. A mixture as claimed in claim 1, wherein said polymeric binder is a copolymer consisting of (a) N-(4-hydroxy-phenyl)maleimide or a unit of the formula I and (b) a unit of the formula II.

17. A mixture as claimed in claim 1, wherein said polymeric binder is a homopolymer consisting of units of the formula III.

18. A mixture as claimed in claim 1, wherein said polymeric binder is a copolymer consisting of units of the formula I and units of the formula III.

19. A mixture as claimed in claim 1, wherein said polymeric binder is a copolymer consisting of units of the formula I, units of the formula II and units of the formula III.

20. A mixture as claimed in claim 1, wherein said polymeric binder is a copolymer consisting essentially of units of formula I and units of formula II.

21. A mixture as claimed in claim i, wherein said polymeric binder is a copolymer consisting essentially of units of formula I and units of formula III.

* * * * *